United States Patent [19]
Hunt et al.

[11] Patent Number: 5,737,274
[45] Date of Patent: Apr. 7, 1998

[54] SENSE AMPLIFIER DESIGN

[75] Inventors: Jeffery Scott Hunt, Ackerman; Satish C. Saripella, Starkville, both of Miss.

[73] Assignee: Cypress Semiconductor Corporation, San Jose, Calif.

[21] Appl. No.: 746,320

[22] Filed: Nov. 12, 1996

[51] Int. Cl.$^6$ ............................................. G11C 7/00
[52] U.S. Cl. ................... 365/205; 365/206; 365/189.06; 365/184.11; 327/351
[58] Field of Search .................................. 365/205, 206, 365/207, 189.06, 198.11; 327/51, 56

[56] References Cited

U.S. PATENT DOCUMENTS

| | | | |
|---|---|---|---|
| 4,871,933 | 10/1989 | Galbraith | 365/208 |
| 5,023,841 | 6/1991 | Akrout et al. | 327/51 |
| 5,093,806 | 3/1992 | Trán | 365/189.06 |
| 5,585,747 | 12/1996 | Proebsting | 327/51 |

*Primary Examiner*—Tran T. Nguyen
*Attorney, Agent, or Firm*—Bliss McGlynn, P.C.

[57] ABSTRACT

The present invention concerns a method and apparatus that generally prevents a glitch from occurring in an output of a sense amplifier during a transition from a strong zero to a weak zero. The present invention detects the voltage difference between a virtual ground node and a read product term line and turns off a pull down of a first stage of the sense amplifier. The low on the read product term line generally causes a node between the first and second stage of the sense amplifier to swing high for both a strong or weak zero condition. A diode clamp generally limits the current drawn under the strong or weak zero condition by clamping the output of the first stage from going too high. When a transition from a strong zero to a weak zero occurs, the output of the first stage essentially remains high since the gate to source drive on the pulldown remains considerably weak.

20 Claims, 3 Drawing Sheets

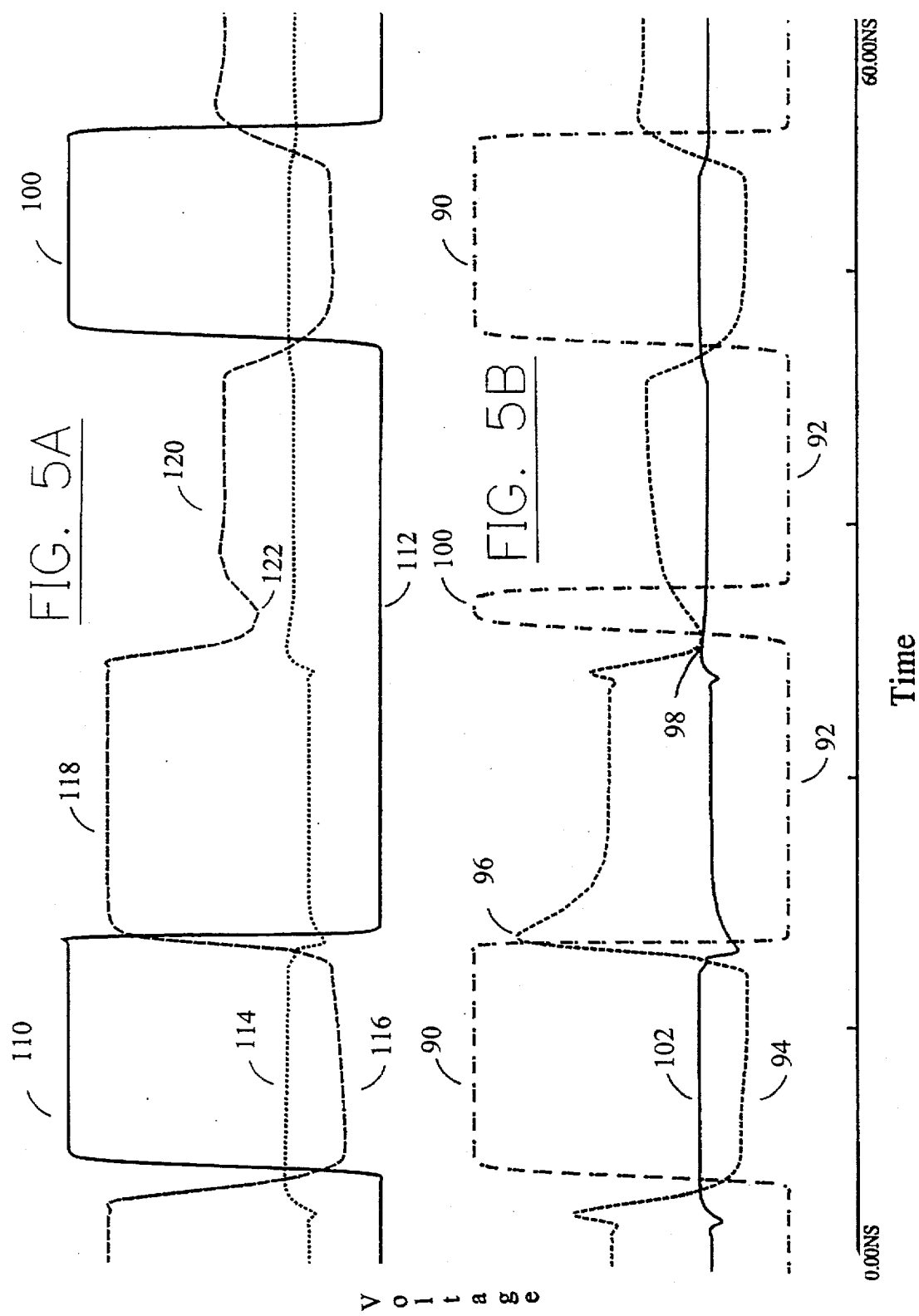

5,737,274

SENSE AMPLIFIER DESIGN

FIELD OF THE INVENTION

The present invention relates to sense amplifiers generally and, more particularly, to a sense amplifier design that eliminates false triggering during a transition between a strong zero and a weak zero condition.

BACKGROUND OF THE INVENTION

One implementation of a high speed sense amplifier used in a programmable logic device (PLD) application involves the use of a virtual ground device to prevent a read product term line (RPT) from swinging too low. The virtual ground device results in very fast access times. However, the use of a virtual ground device creates a situation during a transition from a "strong" zero to a "weak" zero that may create a glitch in the output of the sense amplifier. A weak zero occurs when a single memory cell pulls down on the RPT line. A strong zero results when multiple memory cells pull down on the RPT line. A glitch during the transition between a strong zero and a weak zero is undesirable during normal operation of the sense amplifier. Such a glitch can be particularly troublesome in applications using state machine implementations of the PLD.

Referring to FIG. 1, a previous approach circuit 10 is shown implementing a sense amplifier 12 with a programmable element block 14. The sense amplifier 12 generally comprises a first stage 16 and a second stage 18. The first stage 16 generally comprises a pullup transistor 20, a pulldown transistor 22, a transistor 24, a transistor 26 and a transistor 28. The pullup transistor 20 has a gate that receives a voltage VREF2. The pulldown transistor 22 has a gate that receives the read product term (RPT). The pullup transistor 20 and the pulldown transistor 22 are coupled together and have a node OUT1 that presents an output to the second stage 18. The RPT line is also connected to the programmable element block 14. The programmable element block 14 is also connected to a virtual ground line VGND. The virtual ground line VGND is connected to the drain of the transistor 28. A gate of the transistor 28 receives a reference voltage VREF1.

The programmable element block 14 comprises a number of memory cells 30a~30n. The transistor 24 is shown as a depletion mode NMOS device. If the memory devices 30a~30n are implemented as a floating avalanche metal oxide semiconductor (FAMOS) device operating in a programmable array logic (PAL) mode, the drain is limited to not more than one or two volts to prevent hot electron tunneling, which may corrupt the data stored. The limiting of the drain voltage to one or two volts generally prevents program disturb issues from arising. For high speed applications, large voltage swings on the read product term line RPT are undesirable. Large voltage swings create a delay in recovering the read product term line which is generally capacitive as a result of the connection of the various memory cells 30a~30n.

Referring to FIG. 2, the previous approach circuit 10 is shown in greater detail. The sense amplifier 12 is shown to further comprise a referenced inverter 32 and a buffer 34. The referenced inverter is shown comprising a transistor 36 and a transistor 38. The buffer 34 is shown comprising an inverter 40 and an inverter 42. The transistor 36 receives the voltage reference VREF2 and the transistor 38 receives an input from the node OUT1. The memory cell 30a is shown to be implemented as a transistor 44a and a transistor 46a. Similarly, the memory cell 30n is shown to be implemented as a transistor 44n and a transistor 46n.

The transistor 28 is shown to be an NMOS device that develops a drain voltage based on the number of memory cells 30a~30n that are "on". The voltage developed raises the virtual ground VGND and therefore limits the read product term RPT from swinging too low when a multiple number of memory cells 30a~30n are turned "on". The transistor 26 generally clamps the read product term line RPT from going too high when none of the memory cells 30a~30n are on. The transistor 22 works in combination with the transistor 24 to limit the low level of the read product term line RPT. The signal swing obtained on RPT is amplified by the first stage 16 and further by the referenced inverter 32 to drive the rail-to-rail signal transitions on the output SAOUT. The virtual ground VGND attempts to provide similar low level voltages on the read product term line RPT for both a weak zero and a strong zero condition.

During a transition from a strong zero to a weak zero condition, the node VGND has a large capacitive load and generally does not have adequate time to recover from a strong zero condition. This causes the transient condition to be registered as a logic "high" and switches the output SAOUT to a logic "high" condition for a short time. This momentary glitch creates problems in the overall functioning of the circuit 10. It is generally desirable for the output SAOUT to remain low even during a transition from a strong zero to a weak zero.

SUMMARY OF THE INVENTION

The present invention concerns a method and apparatus that generally prevents a glitch from occurring in an output of a sense amplifier during a transition from a strong zero to a weak zero. The present invention detects the voltage difference between a virtual ground node and a read product term line and turns off a pull down of a first stage of the sense amplifier. The low on the read product term line generally causes a node between the first and second stage of the sense amplifier to swing high for both a strong or weak zero condition. A diode clamp generally limits the current drawn under the strong or weak zero condition by clamping the output of the first stage from going too high. When a transition from a strong zero to a weak zero occurs, the output of the first stage essentially remains high since the gate to source drive on the pulldown remains considerably weak.

The objects, features and advantages of the present invention include providing an improved sense amplifier design that eliminates an output glitch during a transition between a strong zero and a weak zero, maintains a fast transition at the output and minimizes the overall current consumption of the circuit.

BRIEF DESCRIPTION OF THE DRAWINGS

These and other objects, features and advantages of the present invention will be apparent from the following detailed description and the appended claims and drawings in which:

FIG. 5A is a plot of the RPT line, the node OUT1 and the output SAOUT of the present invention circuit of FIGS. 3 and 4; and FIG. 5B is a plot of the RPT line, the node OUT1 and the output SAOUT of the previous approach circuit of FIGS. 1 and 2.

DETAILED DESCRIPTION OF THE PREFERRED EMBODIMENTS

Figure 3:
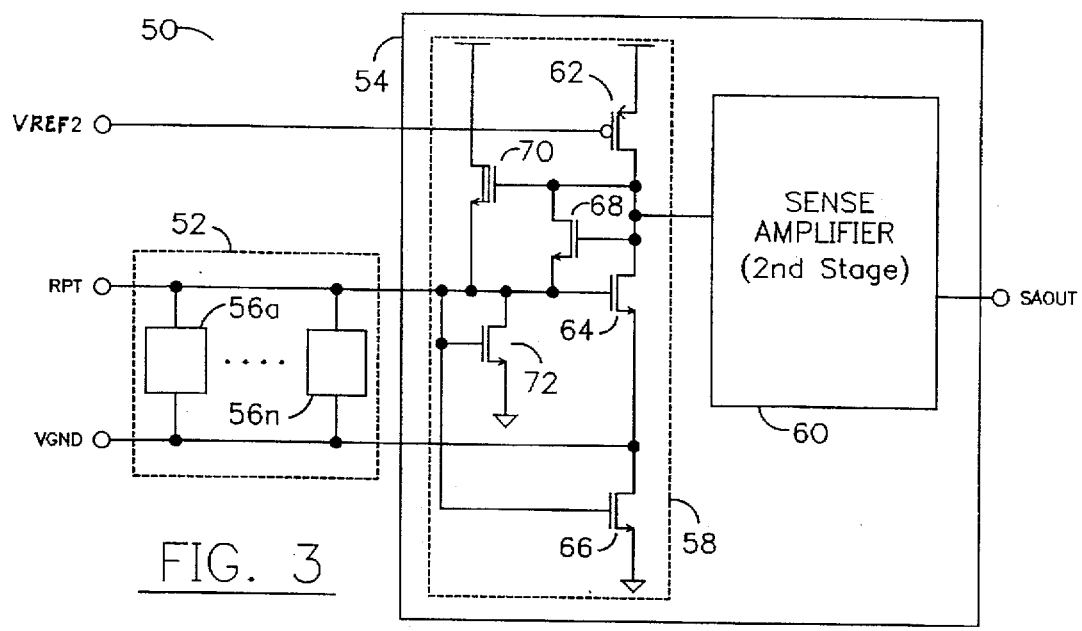
FIG. 3 is a block diagram of a preferred embodiment of the present invention.

Referring to FIG. 3, a block diagram of a circuit 50 is shown in accordance with a preferred embodiment of the present invention. The circuit 50 generally comprises a programmable element block 52 and a sense amplifier 54. The programmable element block 52 generally comprises a number of memory cells 56a–56n. The sense amplifier 54 generally comprises a first stage 58 and a second stage 60. The first stage 58 generally comprises a pullup transistor 62, a pulldown transistor 64, a pulldown transistor 66, a transistor 68, a transistor 70 and a transistor 72. The pullup transistor 62 has a gate that may receive a reference voltage VREF2. A gate of the pulldown transistor 64 is generally connected to a read product term line RPT. The transistors 62 and 64 are generally coupled together with a node OUT1 presenting an output to the second stage 60. A transistor 68 is generally coupled between the node OUT1 and the read product term line RPT. The read product term line RPT is generally coupled to the memory cells 56a–56n. The memory cells 56a–56n are also generally coupled to a virtual ground line VGND. The virtual ground VGND is also coupled to a node A between the transistor 64 and the transistor 66. The transistors 64 and 66 generally provide a serial pulldown path in the first stage 58 of the sense amplifier 54.

Figure 4:
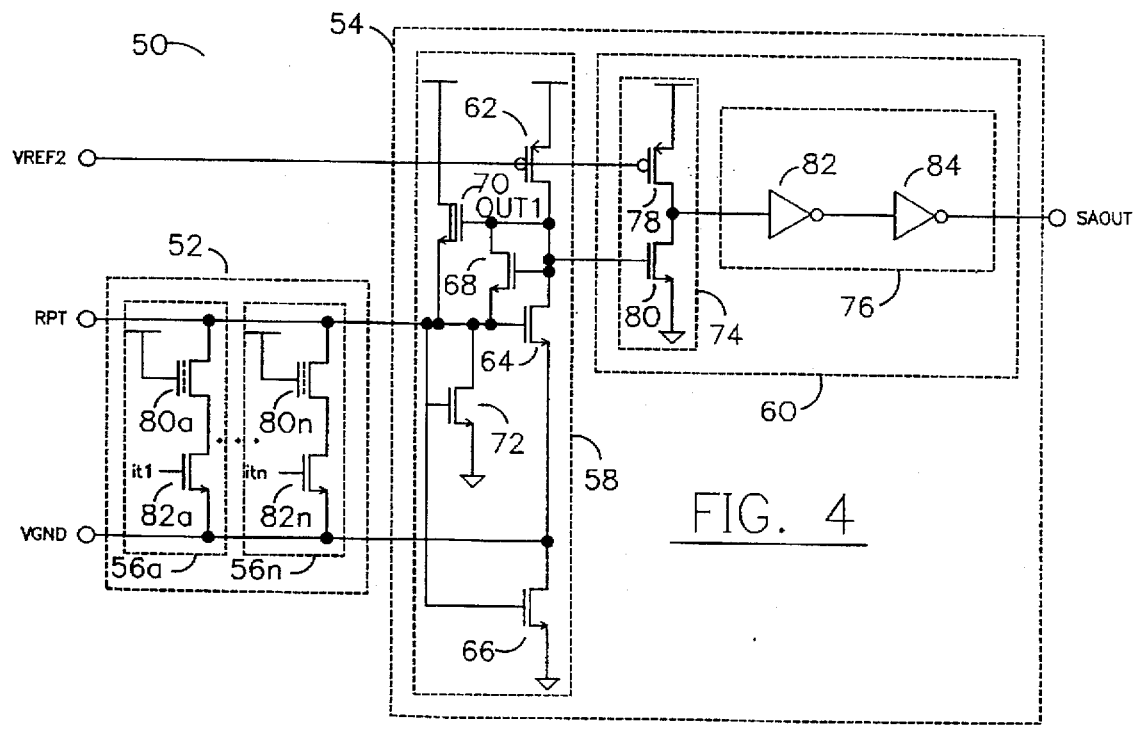
FIG. 4 is a more detailed circuit diagram of a preferred embodiment of the present invention.

Referring to FIG. 4, the circuit 50 is shown in greater detail. The second stage 60 generally comprises a referenced inverter 74 and a buffer 76. The referenced inverter 74 generally comprises a transistor 78 and a transistor 80. The buffer 76 generally comprises an inverter 82 and an inverter 84. The transistor 78 has a gate that generally receives the voltage reference signal VREF2. A gate of the transistor 80 generally receives a signal from the node OUT1. The transistors 78 and 80 are generally coupled together with a node B generally presenting a signal to the buffer 76. The buffer 76 generally presents a signal SAOUT.

The memory cell 56a generally comprises transistor 80a and a transistor 82a. Similarly, the memory cell 56n generally comprises a transistor 80n and a transistor 82n. A transistor 72 is generally coupled between the read product term line RPT and ground. The memory cells 56a–56n may be implemented as non-volatile memories such as Erasable Programmable Read Only Memories (EPROMs) or flash cells. However, other non-volatile memories may be used to meet the design criteria of a particular application.

A strong zero situation occurs when multiple memory cells 56a–56n are turned "on" and the virtual ground line VGND is raised high due to the current flowing through the virtual ground device (i.e., the pulldown transistor 66). The pulldown transistor 64 generally experiences a reduction in gate drive from both the gate and the source. This reduction in gate drive causes the node OUT1 to swing high. The transistor 68 acts as a diode clamp that connects between the node OUT1 and the read product term line RPT. The transistor 68 generally limits the current drawn under the strong or weak zero condition by clamping the node OUT1 from going too high. The transistor 68 also limits the gate to source voltage of the transistor 70. During the transition from a strong zero to a weak zero, the node OUT1 essentially remains high in response to the gate to source drive on the pulldown transistor 64 remaining considerably weak. As a result, the output SAOUT remains low and any glitches are generally eliminated.

The transistor 72 generally clamps the read product term line RPT from going too high when none of the memory cells 56a–56n are on. The transistor 70 and the transistor 72 generally work in combination to limit the high state of the read product term line RPT. The transistor 70 also works with the transistor 64 to limit the low level of the read product term line RPT. The transistor 70 generally limits the gate to source voltage of the transistor 64.

If the gate of the transistor 70 increases to VCC, there would generally be a large amount of current through the memory cells 56a–56n. The clamping transistor 68 generally limits the amount of current consumed by the circuit 50. Instead of the gate of the transistor 70 going all the way to VCC, the transistor 68 clamps the upper limit to a value generally lower than VCC. As a result, less current is consumed through the path. Current flows through the depletion transistor 70 and the diode 68, but the overall current consumption is less than what it would be if the node OUT1 is allowed to go to VCC. Additionally, since the node OUT1 is not at VCC, the transition recovery time is reduced, which decreases the delay to the output SAOUT and increases the overall speed of the circuit 50. It is generally desirable to minimize the swing of node OUT1, while maintaining gain in the referenced inverter 74 to achieve full rail swing on the output SAOUT, which increases the speed of the circuit 50.

If a single memory cell 56a–56n is on, an overall current in the range of approximately 50 microamps may flow through the cell. If many memory cells 56a–56n are on, 5 microamps may flow through each cell. When all memory cells except for one turn off, the amount of current through the single memory cell generally needs to transition from 5 microamps back to 50 microamps to keep the output SAOUT low. This is difficult to accomplish instantaneously and generally creates the glitch described in connection with FIG. 1 and FIG. 2. Since the recovery time on node A responds slowly due to high capacitive loading, the pulldown transistor 64 remains considerably weak, which generally removes any glitches from the output SAOUT.

The transistor 68 may not be required to stop the glitch at the output SAOUT. However, the transistor 68 generally reduces the overall current used by the circuit 50. The transistor 70 is shown generally as a depletion mode NMOS device. The transistors 64, 66, 68 and 72 are shown generally as NMOS enhancement devices. The transistors 62 and 78 are shown generally as PMOS devices. Other devices may be substituted for the transistors 62, 64, 66, 68, 70, 78 and 80 in accordance with the design criteria of a particular application.

Figure 1:
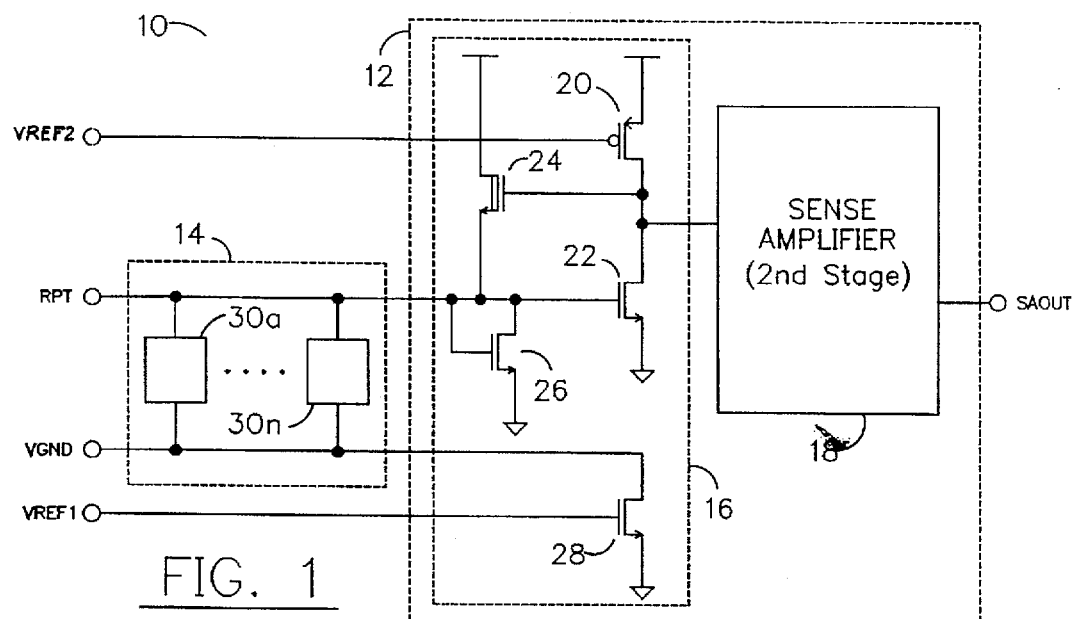
FIG. 1 is a block diagram of a previous approach circuit implementing a sense amplifier.
Figure 2:
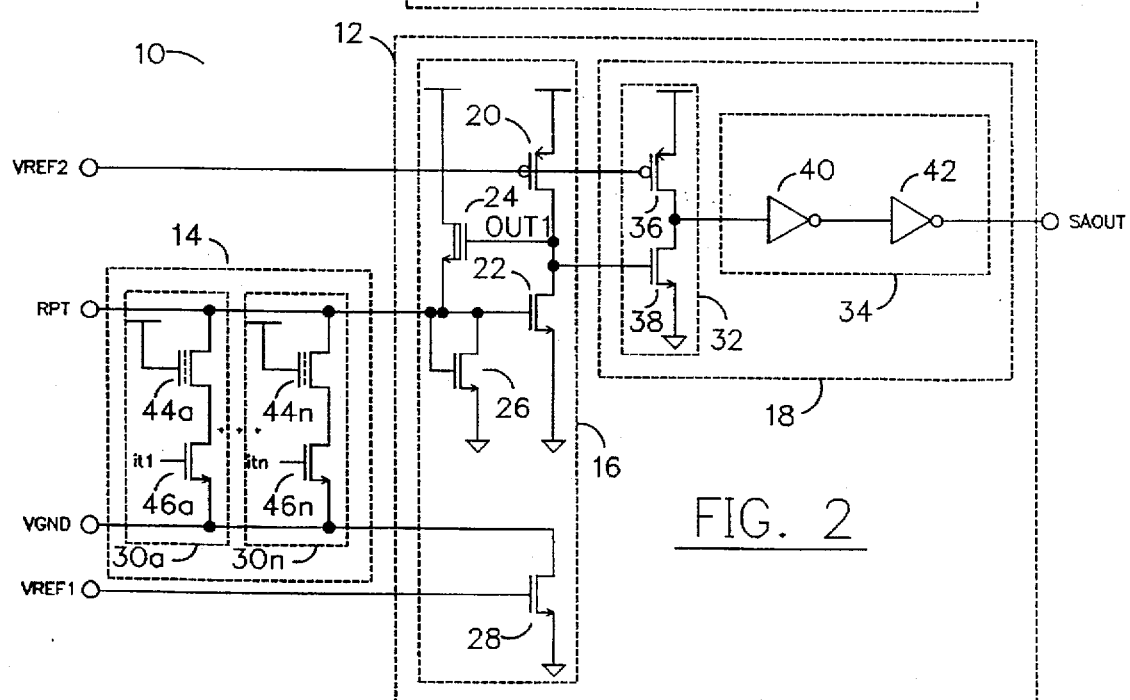
FIG. 2 is a more detailed circuit diagram of the previous approach sense amplifier shown in FIG. 1.

Referring to FIG. 5A, a plot of the read product term line RPT, the output SAOUT and the node OUT1 of the circuit of FIG. 3 and FIG. 4 is shown. Referring to 5B, a plot of the read product term line RPT, the node OUT1 and the output SAOUT of the circuit of FIGS. 1 and 2 is shown. FIGS. 5A and 5B graphically illustrate the comparison between the circuit 50 and the circuit 10. In FIG. 5B, the output SAOUT is generally high at a portion 90 and is low at a portion 92. The node OUT1 is shown having a low portion 94, a spike 96 and a dip 98. After the dip 98 in the node OUT1, the output SAOUT has an apparent glitch 100. The RPT line is shown generally as a trace 102.

Referring back to FIG. 5A, the output SAOUT is shown having a high portion 110 and a low portion 112. The read product term line RPT is shown generally as a trace 114. The node OUT1 is shown having a low portion 116, a high portion 118 and a transition portion 120. A dip 122 is shown in the node OUT1 which is generally at a higher voltage than the RPT line. As a result, the output SAOUT remains at the low portion 112 throughout the transition of the node OUT1.

While the invention has been particularly shown and described with reference to the preferred embodiments thereof, it will be understood by those skilled in the art that various changes in form and details may be made without departing from the spirit and scope of the invention.

We claim:

1. A circuit having a read line, a ground line and a reference line comprising:

a first stage configured to generate a first output in response to said read line, said ground line and said reference line, wherein said first stage comprises: (i) a pullup section coupled to said reference line (ii) a first pulldown section coupled to said pullup section and to said read line and (iii) a second pulldown section coupled between said first pulldown section and said read line, wherein said first and second pulldown sections provide a constant signal at the first output during a glitch condition; and a second stage configured to provide a second output in response to said first output.

2. The circuit according to claim 1 wherein said glitch condition comprises a transition between a strong zero and a weak zero.

3. The circuit according to claim 2 further comprising:

a programmable logic device comprising a plurality of memory cells connected between said read line and said ground line.

4. The circuit according to claim 3 wherein said strong zero occurs when more than one of said memory cells are active and said weak zero occurs when only one of said memory cells is active.

5. The circuit according to claim 1 further comprising:

a clamp coupled between the read line and the first output.

6. The circuit according to claim 5 wherein said clamp comprises a transistor configured as a diode.

7. The circuit according to claim 1 wherein said read line comprises a read product term line.

8. The circuit according to claim 1 wherein said ground line comprises a virtual ground line.

9. The circuit according to claim 1 wherein said reference line comprises a voltage reference line.

10. A circuit having a read line, a ground line and a reference line comprising:

means for generating a first output in response to said read line, said ground line and said reference line wherein said generator means comprises: (i) pullup means coupled to said reference line (ii) first pulldown means coupled to said pullup means and to said read line and (iii) second pulldown means coupled between said first pulldown means and said read line, wherein said first and second pulldown means provide a constant signal at a first output during a glitch condition; and second means for generating a second output in response to said first output.

11. The circuit according to claim 10 wherein said glitch condition comprises a transition between a strong zero and weak zero.

12. The circuit according to claim 11 further comprising:

logic means comprising a plurality of memory cells coupled between said read line and said ground line.

13. The circuit according to claim 12 wherein said strong zero occurs when more than one of said memory cells are active and said weak zero occurs when only one of said memory cells is active.

14. The circuit according to claim 10 further comprising:

means for limiting the voltage between the read line and the first output.

15. The circuit according to claim 14 wherein said limiting means comprises a transistor configured as a diode.

16. The circuit according to claim 10 wherein said read line comprises a read product term line.

17. The circuit according to claim 10 wherein said ground line comprises a virtual ground line.

18. The circuit according to claim 10 wherein said reference line comprises a voltage reference line.

19. A method for providing a constant signal during a glitch condition comprising the steps of:

generating a first output in response to a read line, a ground line and a reference line; and generating a second output in response to said first output, wherein said second output comprises said constant signal during said glitch condition.

20. The method according to claim 19 further comprising the step of:

generating said first output in response to a plurality of memory cells connected between said read line and said ground line, wherein said glitch condition occurs during a transition between a strong zero and a weak zero, wherein said strong zero occurs when more than one of said memory cells are active and said weak zero occurs when only one of said memory cells is active.

* * * * *